(12) United States Patent
Landis

(10) Patent No.: US 9,418,844 B1
(45) Date of Patent: Aug. 16, 2016

(54) SELENIUM INTERLAYER FOR HIGH-EFFICIENCY MULTIJUNCTION SOLAR CELL

(71) Applicant: The United States of America as represented by the Administrator of the National Aeronautics and Space Administration, Washington, DC (US)

(72) Inventor: Geoffrey A. Landis, Berea, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/814,898

(22) Filed: Jul. 31, 2015

Related U.S. Application Data

(62) Division of application No. 13/364,691, filed on Feb. 2, 2012, now Pat. No. 9,117,948.

(51) Int. Cl.
| | |
|---|---|
| *H01L 31/18* | (2006.01) |
| *H01L 21/06* | (2006.01) |
| *H01L 31/0725* | (2012.01) |
| *H01L 31/0687* | (2012.01) |
| *H01L 21/02* | (2006.01) |
| *H01L 27/142* | (2014.01) |
| *H01L 31/076* | (2012.01) |
| *H01L 31/0232* | (2014.01) |
| *H01L 31/0272* | (2006.01) |

(52) U.S. Cl.
CPC ........ *H01L 21/02568* (2013.01); *H01L 27/142* (2013.01); *H01L 31/0687* (2013.01); *H01L 31/076* (2013.01); *H01L 31/0725* (2013.01); *H01L 31/184* (2013.01); *H01L 31/1864* (2013.01)

(58) Field of Classification Search
CPC ................ H01L 31/06875; H01L 31/0725; H01L 31/076
See application file for complete search history.

(56) References Cited

U.S. PATENT DOCUMENTS

| | | | |
|---|---|---|---|
| 4,638,111 A | 1/1987 | Gay | |
| 4,680,422 A * | 7/1987 | Stanbery | H01L 31/0725 136/249 |
| 4,686,323 A | 8/1987 | Biter et al. | |
| 4,914,044 A | 4/1990 | Grabmaier et al. | |
| 5,009,719 A * | 4/1991 | Yoshida | H01L 31/022425 136/249 |
| 5,846,638 A | 12/1998 | Meissner | |
| 6,537,846 B2 | 3/2003 | Lee et al. | |
| 6,736,986 B2 | 5/2004 | Stanbery | |
| 7,141,834 B2 | 11/2006 | Atwater, Jr. et al. | |
| 7,217,882 B2 | 5/2007 | Walukiewicz et al. | |
| 7,846,759 B2 | 12/2010 | Atwater, Jr. et al. | |
| 2005/0161078 A1 | 7/2005 | Aiken | |
| 2008/0023059 A1* | 1/2008 | Basol | H01L 31/022466 136/244 |
| 2010/0059111 A1 | 3/2010 | Shin et al. | |
| 2011/0174366 A1* | 7/2011 | Frolov | H01L 31/0725 136/255 |

* cited by examiner

*Primary Examiner* — Victor A Mandala
*Assistant Examiner* — Regan J Rundio
(74) *Attorney, Agent, or Firm* — Robert H. Earp, III

(57) ABSTRACT

A multi-junction solar cell is provided and includes multiple semiconducting layers and an interface layer disposed between the multiple semiconducting layers. The interface layer is made from an interface bonding material that has a refractive index such that a ratio of a refractive index of each of the multiple semiconducting layers to the refractive index of the interface bonding material is less than or equal to 1.5.

16 Claims, 2 Drawing Sheets

SELENIUM INTERLAYER FOR HIGH-EFFICIENCY MULTIJUNCTION SOLAR CELL

ORIGIN OF THE INVENTION

The invention described herein was made by an employee of the United States Government and may be manufactured and used only by or for the Government for Government purposes without the payment of any royalties thereon or therefore.

CROSS-REFERENCE TO RELATED APPLICATIONS

This application claims the benefit of U.S. Non-Provisional Utility application Ser. No. 13/364,691 entitled "Selenium Interlayer for High-Efficiency MultiJunction Solar Cell" filed on Feb. 2, 2012. The entirety of the above-noted application is incorporated by reference herein.

BACKGROUND

Conventional space solar cells used in current space applications have an energy conversion efficiency of approximately 30%. Although, the efficiency of space solar cells is high as compared to terrestrial solar cells, which have an efficiency of approximately 15%, it is desired to increase the energy conversion efficiency of space solar cells to approximately 40 to 50%.

Conventional space solar cell technology achieves the 30% energy conversion efficiency by growing sequential layers of three different semiconductor materials, where each semiconductor material has a different bandgap. As a result, each different semiconductor material responds more efficiently to a different portion of the solar spectrum. Increasing the efficiency to the desired 40 to 50% requires increasing the number of layers in the solar cell. This, however, is a difficult task.

One conventional growth method is the lattice-matched growth method, where materials, typically III-V materials, are grown on top of one another to form a stack. In this method, however, the materials that can be utilized are limited because each layer in the stack must have the same crystal lattice, with the same atomic spacing. Thus, the efficiency of the solar cell is limited due the limited choice of materials.

Another conventional growth technique, referred to as inverted metamorphic (IMM) growth, allows the crystal lattice constraint to be somewhat relaxed. The downside, however, is that some defects are introduced into the last crystalline layer grown. In addition, once the cell is grown, the cell must be removed from the substrate on which it is grown. The reason for this is that the cell must be inverted to place the most-defective material (the last layer grown) on the bottom rather than on the light-facing side of the final cell. Other disadvantages with this technique are that that amount of lattice mismatch is limited and the mismatched layers must be kept thin. This results in an extremely thin and fragile cell. Consequently, the cell cannot be fully optimized for highest performance.

Still yet another conventional method to make solar cells with an increased efficiency would be to grow semiconductor layers on two different wafers and then bond the two wafers together to form a multi junction cell. This method permits the use of different semiconductor materials without a constraint on the lattice constant. For example, silicon, which is a low-cost material, can be used as a wafer for the bottom cell. Conventional bonding methods, however, to bond the wafers together to form the multi-junction cell employ a transparent polymer or glue to affix the wafers together. The transparent polymer or glue has a low refractive index in the range of approximately 1.3 to 1.5. As a result, this produces a large amount of reflection at each interface, because the reflection coefficient is proportional to the square difference of the refractive indices of the materials.

SUMMARY

The following presents a simplified summary in order to provide a basic understanding of some aspects of the innovation. This summary is not an extensive overview of the innovation. It is not intended to identify key/critical elements or to delineate the scope of the innovation. Its sole purpose is to present some concepts of the innovation in a simplified form as a prelude to the more detailed description that is presented later.

The innovation disclosed and claimed herein, in one aspect thereof, comprises a multi junction solar cell that includes a plurality of semiconducting layers and an interface layer disposed between the plurality of semiconducting layers. The interface layer is made from an interface bonding material that has a refractive index such that a ratio of a refractive index of each of the plurality of semiconducting layers to the refractive index of the interface bonding material is less than or equal to 1.5.

The innovation disclosed and claimed herein, in another aspect thereof, comprises a multi-junction solar cell that includes a first semiconducting layer having a first bandgap, a second semiconducting layer having a second bandgap, and an interface layer having a third bandgap and being disposed between the first semiconducting layer and the second semiconducting layer. The first bandgap of the first semiconducting layer is greater than the second bandgap of the second semiconducting layer and the third bandgap of the interface layer is greater than both the first bandgap of the first semiconducting layer and the second bandgap of the second semiconducting layer.

In still another aspect of the innovation, the interface bonding material is made from selenium.

DETAILED DESCRIPTION

Figure 1:
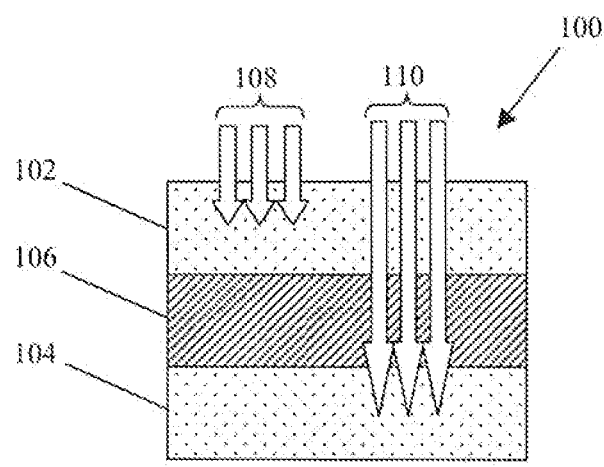
FIG. 1 is a block diagram representation of a multi junction solar cell in accordance with the innovation.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details.

While specific characteristics are described herein (e.g., thickness), it is to be understood that the features, functions and benefits of the innovation can employ characteristics that vary from those described herein. These alternatives are to be included within the scope of the innovation and claims appended hereto.

Further, in view of the aspects and features described, methodologies that may be implemented in accordance with embodiments of the subject innovation will be better appreciated with reference to the figures. While for purposes of simplicity of explanation, the methodologies are shown and described as a series of drawings representing steps or acts associated with the methodologies, it is to be understood and appreciated that the claimed subject matter is not limited by the order of the drawings, as some drawings may occur concurrently with other drawings and/or in different orders than what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated drawings may be required to implement the methodologies described hereinafter.

Solar cells, also referred to as a photovoltaic cell, are an increasingly important source of electrical power for space-based application, such as satellites. As mentioned above, the energy conversion efficiency of solar cells is approximately 30%. Thus, a goal of the innovation disclosed herein is to produce a multi junction solar cell to overcome the above mentioned disadvantages to thereby increase the efficiency of solar cells. This can be accomplished by utilizing an interface bonding material in the multi-junction solar cell that has a high refractive index in the wavelengths of interest to avoid interface reflection due to a mismatch with the wafer refractive index. In addition, the interface bonding material must have a suitable bandgap such that the interface bonding material is transparent to light in the wavelengths of interest. The innovation described herein and shown in the figures, in one aspect thereof, is representative of such a multi-junction solar cell, which incorporates selenium as the interface bonding material between the wafers.

With reference now to the figures, FIG. 1 is a block diagram illustrating an example embodiment of a multi junction solar cell 100 in accordance with the innovation. The multi-junction solar cell 100 includes a first (or upper) layer (or sub-cell) 102, a second (or lower) layer (or sub-cell) 104 and an interface layer 106 disposed between the first and second layers 102, 104. It is to be appreciated that although the multi-junction solar cell 100 in the figures is shown having a first and a second layer 102, 104, any multi junction solar cell having two or more layers is within the scope of the invention. Thus, the embodiment described herein and shown in the figures is for illustrative purposes only and is not intended to limit the scope of the innovation. It is to be further appreciated that the material chosen for the first and second layers 102, 104 are selected based on the bandgap of the material and not based on matching lattice constants.

The bandgap or bandgap energy of a material, expressed in electron-volts (eV), is the energy required for an electron to jump from the valence band to the conduction band. If the material absorbs enough light energy (photon), an electron can gain enough energy to jump from the valence band to the conduction band. Thus, the bandgap can also be thought of as an energy range of a material (solid) that determines what portion of the solar spectrum each layer of the solar cell absorbs. When the multi-junction solar cell 100 absorbs light energy from the sun, the multi junction solar cell 100 generates electricity through the photovoltaic effect, which is the creation of a voltage or corresponding current in a material upon its exposure to light. If, however, the light has a photon energy lower than the bandgap, the light will simply pass through the material as if the material was transparent. If, on the other hand, the light has too much energy (energy greater than the bandgap) the extra energy over and above the bandgap is lost. Using a material with a lower bandgap can absorb more energy, but it does have disadvantages. For example, the bandgap also determines the strength (voltage) of the electric field. Thus, if the bandgap is too low, any extra current gained through the absorption of more light is lost due to the lower voltage.

The bandgap of the interface layer 106 is also just as important as the bandgap of the first and second layers 102, 104. Specifically, the bandgap of the interface layer 106 must be such that the interface layer 106 is transparent to light at photon energies below the bandgap. Thus, the interface layer 106 may be made from any suitable material having the bandgap properties described above, such as but not limited to selenium.

Selenium is a semiconductor and is, thus, conductive. Selenium, however, is transparent to light at photon energies below the bandgap, which makes it a suitable interface layer 106. Specifically, using units commonly used in semiconductor devices, the relationship between bandgap and a corresponding wavelength is wavelength λ equals the speed of light c (3E-8 m/s) times Plancks constant h (4.135667 E-15 eVs) divided by the bandgap $E_g$ (eV) or $\lambda = hc/E_g$, expressed in nanometers (nm). Since Plancks constant h times the speed of light c is equal to 1241 nm, the corresponding wavelength λ is equal to 1241 nm/$E_g$. The corresponding wavelength λ of the interface layer 106 can essentially be defined as a cutoff wavelength $\lambda_{co}$. Specifically, because light with longer wavelengths have a lower photon energy and light with shorter wavelengths have a higher photon energy, light having a wavelength longer than the cutoff wavelength $\lambda_{co}$ of the interface layer 106 will pass through the interface layer 106. Conversely, light having a wavelength shorter than the cutoff wavelength $\lambda_{co}$ of the interface layer 106 will be absorbed by the interface layer 106. For example, nanocrystalline selenium has a bandgap of 1.76 eV and a cutoff wavelength $\lambda_{co}$ of 705 nm. Thus, light having a wavelength longer than 705 nm will pass through the selenium to the second layer 106. Similarly, amorphous selenium has a bandgap of 2.0 eV, which can be reduced to 1.83 eV by annealing, which corresponds to a cutoff wavelength $\lambda_{co}$ of 620 nm and 678 nm respectively. Thus, light having a wavelength longer than 620 nm for amorphous selenium and 678 nm for annealed selenium, will pass through the selenium to the second layer 104. As a result, selenium, nanocrystalline, amorphous or annealed, is transparent for wavelengths longer than 620 nm.

Referring again to FIG. 1, incident light having a short wavelength is represented by arrows 108 and light having a longer wavelength is represented by arrows 110 are shown. The layers or sub-cells in multi junction solar cells are arranged such that the bandgap decreases from the first or upper layer to the last or bottom layer. Thus, the light having the shorter wavelength 108 will be absorbed by the first layer 102, because the bandgap of the first layer 102 is such that the photon energy of the light causes an electron to jump from the valence band to the conduction band. Conversely, the light having the longer wavelength 110 does not have the requisite energy and, thus will pass not only thorough the first layer 102, but also through the interface layer 106 and will be absorbed by the second layer 104. For example, the semiconductor gallium arsenide GaAs has a bandgap of 1.43 eV and a corresponding cutoff wavelength $\lambda_{co}$ of approximately 870 nm. Thus, if GaAs is the first layer 102, any light having a wavelength less than 870 nm will be absorbed by the GaAs and any light having a wavelength greater than 870 nm will pass through the GaAs. Further, because light with a wavelength of 870 nm is greater than the cutoff wavelength $\lambda_{co}$ (620 nm) of the selenium, the light will also pass through the interface layer 106. It is to be appreciated that the first layer 102 may be made from any type of semiconducting material from the III-V semiconductor family, such as but not limited to gallium arsenide GaAs, gallium indium phosphide GaInP, indium gallium arsenide phosphide InGaAsP, etc. It is further to be appreciated that additional layers or sub-cells made from the above materials may be added to absorb a broader range of the solar spectrum.

As mentioned above, the interface layer 106 must have a high refractive index in the wavelengths of interest to avoid interface reflection due to a mismatch with the layer or sub-cell refractive index. The refractive index, among other things, is the measurement of the bending of light when the light passes from one medium to another medium. In addition, as mentioned above, the reflection coefficient is proportional to the square difference of the refractive indices of the materials. Thus, as the difference between the refractive index of two mediums increases, the reflection coefficient increases. As a result, the amount of reflected light increases at the interface of the two mediums, thereby increasing the amount of lost energy because the reflected light is not absorbed by the medium. Therefore, reducing the difference between the refractive indices of two mediums will reduce the amount of reflected light at the interface of the two mediums, thereby reducing the amount of lost energy and increasing the efficiency of the multi junction solar cell 100.

For example, the refractive index for selenium is approximately 2.8 in the wavelengths of interest, which is approximately 800 to 1000 nm. These values are closer to the refractive index of commonly used materials for the solar cell layers 102, 104 than the values for conventional bonding materials, such as polymers and glass, which have a refractive index in the range of 1.3 to 1.5. Gallium arsenide GaAs and gallium indium phosphide GaInP, for example, have a refractive index of approximately 3.9 and 3.5 respectively. Thus, the difference between the refractive index of selenium and the refractive index of the above materials is at least half of the difference between the refractive index of the conventional bonding materials and the refractive index of the above materials. As a result, the amount of reflected at the interface between the interface layer 106 and the first and second layers 102, 104 is reduced, thereby reducing the amount of lost energy and increasing the efficiency of the multi-junction solar cell 100.

The difference between the refractive indices of the first and second layers 102, 104 and the interface layer 106 can also be measured by a ratio. Specifically, the smaller the ratio between the refractive index of either the first or second layer 102, 104 to the refractive index of the interface layer 106, the smaller the difference between the refractive indices. For example, the ratio of the refractive indices of GaAs and GaInP, to the refractive index of selenium is 1.4 and 1.25 respectively. Conversely, the ratio of the refractive indices of GaAs and GaInP to the refractive index of conventional bonding materials (using 1.4 as an average) is 2.78 and 2.5 respectively. Thus, having a refractive index ratio less than or equal to 1.5 reduces the amount of lost energy and increases the efficiency of the multi junction solar cell 100.

Figure 2:
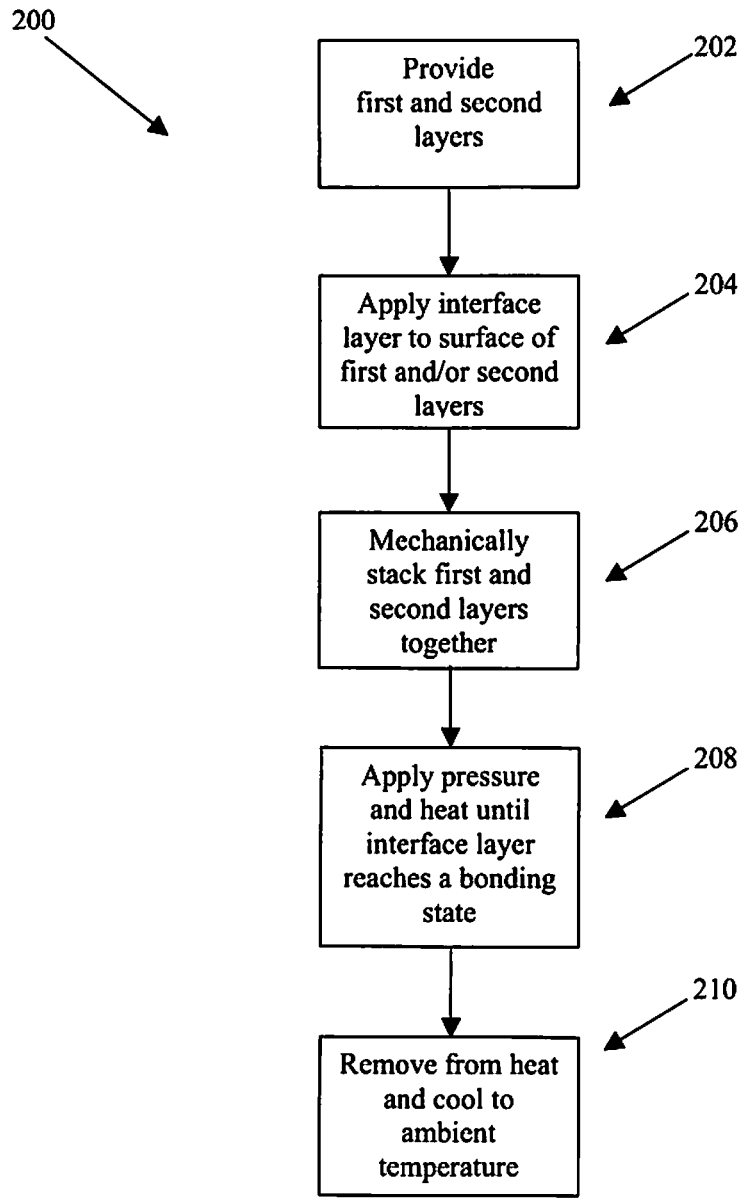
FIG. 2 illustrates an example fabrication process of the multi-junction solar cell in accordance with the innovation

With reference to FIGS. 1 and 2, FIG. 2 illustrates a process to fabricate the multi-junction solar cell 100 shown in FIG. 1. Again, it is to be appreciated that the following process can be applied to multi junction solar cells having more than two junctions. At step 202 the first layer 102 and the second layer 104 are provided as semiconducting wafers, where each semiconductor wafer includes at least one p-n junction. At step 204, an interface bonding material, which serves as the interface layer 106, is applied to either a bottom surface of the first layer 102 or to a top surface of the second layer 104 by a known technique, such as vacuum deposition. It is to be appreciated that in another embodiment, the interface bonding material may be applied to both the bottom surface of the first layer 102 and to the top surface of the second layer 104. At step 206, the first and second layers 102, 104 are mechanically stacked together to such that the interface bonding material is between the first and second layers 102, 104, thereby forming the interface layer 106. At step 208, a pressure is applied to the multi junction solar cell 100 while the multi-junction solar cell 100 is heated to a temperature for a period sufficient for the interface layer 106 to reach a bonding state to adhere the first and second layers 102, 104 together. Finally, at step 210, the multi-junction solar cell 100 is cooled to an ambient temperature.

In the embodiment described herein, the solar cell 100 is heated until the interface layer 106 reaches a bonding state to adhere the first and second layers 102, 104 together. The bonding state of the interface layer 106 is in a range of temperatures that extends above and below the melting temperature of the interface layer 106. In the example embodiment disclosed herein, the interface layer 106 is selenium, which has a melting temperature of 221° C. If the interface layer 106 is heated to a temperature above the melting temperature (i.e. liquid state), small surface imperfections or deviations from flatness can be accommodated, and as a result a good optical and mechanical interface can be achieved. If, however, the wafer surfaces are polished, bonding or adhesion can be achieved at a temperature below the melting temperature. For example, if the wafer surfaces are polished, then by applying pressure, adhesion can be achieved at temperatures up to approximately 50° C. below the melting point.

In the resulting multi-junction solar cell 100 shown in FIG. 1, either the first or second layer 102, 104 can be the mechanical substrate for the multi junction solar cell 100. The mechanical substrate is thicker than the remaining layer or layers and the interface layer 106. Further, the mechanical substrate provides stability for the multi-junction solar cell 100. Still further, both the first and second layer 102, 104 may have multiple photovoltaic junctions, as illustrated in FIG. 3 and described below.

Figure 3:
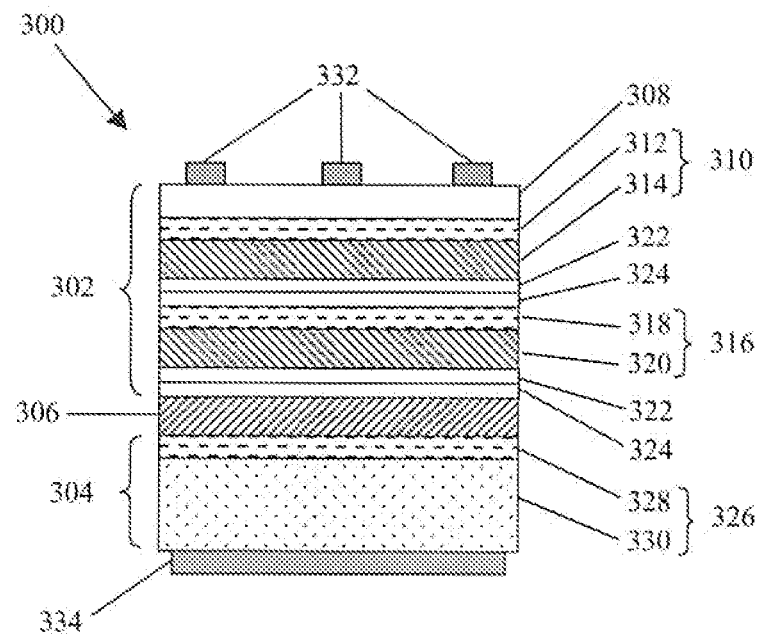
FIG. 3 is a block diagram representation of a three-junction solar cell incorporating the innovation disclosed herein.

FIG. 3 is a block diagram illustration of a three junction solar cell 300 implementing the interface bonding material, specifically selenium, in accordance with the innovation. Specific details of the fabrication of layers having multiple junctions, including tunnel junctions, are well known in the art and will not be described herein. The three junction solar cell 300 includes a first layer 302 and a second layer 304 that serves as the mechanical substrate, and an interface layer 306 comprised of selenium. The first layer 302 includes a wide bandgap window layer 308, a top sub-cell 310 having an n-type emitter 312 and a p-type base 314, a middle sub-cell 316 having an n-type emitter 318 and a p-type base 320, and multiple $p^+$ and $n^+$ tunnel junction layers 322, 324 disposed between the top sub-cell 310 and the middle sub-cell 316, and the middle sub-cell 316 and the interface layer 306. The $p^+$ and $n^+$ tunnel junction layers 322, 324 provide an electrical connection between the top sub-cell 310 and the middle sub-cell 316, and the middle sub-cell 316 and the interface layer 306. The second layer 304 includes a bottom sub-cell 326 having an n-type emitter 328 and a p-type base 330. Upper and lower electrodes 332, 334 are located on the top and bottom of the solar cell 300 respectively to provide electrical connections for the solar cell 300.

As mentioned above, one objective of the innovation disclosed herein is to achieve a higher efficiency solar cell using selenium as an interface layer. Another objective is to achieve this efficiency utilizing a low cost silicon wafer as the bottom layer, which would serve as the mechanical substrate. Thus, in an optimum configuration, the first or top layer would include two or more series-connected junctions, such as GaInP$_2$/GaAs, and the bottom element may also include two or more series-connected silicon junctions, to allow solar cells to be made with four or more junctions. This would allow efficiencies of well over 40% to be achieved. Specifically, relaxing the lattice constant constraint allows for an efficiency greater than existing 3-junction cells, and demonstrates the use of the low-cost Silicon as the bottom layer. Thus, the innovation disclosed herein will allow a multi-junction solar cell to be made without the constraint of lattice matching and with the use of a low-cost silicon wafer as the supporting bottom layer. This would simultaneously reduce the cost of the solar cell and make the solar cell more rugged and more efficient than existing space solar cell designs.

In particular, high-efficiency solar cells today are typically grown from materials chosen from the family of materials known as III-V semiconductors. The term "III-V" indicates a semiconductor that is made as a chemical compound of one or more elements from the third column of the periodic table ("group III"), combined with one or more elements from the fifth column of the periodic table ("group V"). Such III-V semiconductors include compounds such as the binary semiconductor GaAs, made from the group III element gallium combined with the group V element arsenic, as well as more complicated formulations such as the ternary compound family gallium-indium phosphide, GaInP, in which a group III portion consisting of both gallium and indium is combined with the group V element phosphorus, or the quaternary formulation GaInAsP, in which the group V portion consists of both arsenic and phosphorus. These materials are well known in the art.

Finally, another advantage to the use of selenium is that selenium has a melting point of 221 degrees C. This is well above the operating temperature of solar cells, even in worst-case thermal conditions, but still lower than the threshold at which completed solar cells are thermally damaged.

In summary, selenium is selected as the interlayer due to its numerous characteristic advantages. For example, selenium has a high refractive index, a good conductivity, a high band gap, a high optical transparency in the wavelengths of interest, a low melting temperature, and a low toxicity. Further, selenium is a type of material that is inexpensive and has an ease of deposition by thin film techniques.

What has been described above includes examples of the innovation. It is, of course, not possible to describe every conceivable combination of components or methodologies for purposes of the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. The method of manufacturing a multi-junction solar cell comprising:
    providing a plurality of semiconducting layers; and
    applying an interface layer consisting of selenium disposed between the plurality of semiconducting layers, wherein the interface layer has a refractive index such that a ratio of a refractive index of each of the plurality of semiconducting layers to the refractive index of the selenium interface layer is less than or equal to 1.5.

2. The method of claim 1, wherein a bandgap of each of the plurality of semiconducting layers decreases from a topmost semiconducting layer to a bottommost semiconducting layer.

3. The method of claim 1, wherein a bandgap of the selenium interface layer is higher than a bandgap of each of the plurality of semiconducting layers.

4. The method of claim 1, wherein each of the plurality of semiconducting layers not including a bottommost layer is made from semiconducting material from the III-V semiconductor family.

5. The method of claim 4, wherein the bottommost layer of the plurality of semiconducting layers is a silicon layer.

6. The method of claim 1, wherein at least one of the plurality of semiconducting layers includes a first sub-cell and a second sub-cell, and wherein the first sub-cell has a bandgap greater than a bandgap of the second sub-cell.

7. The method of claim 6, wherein the first sub-cell and the second sub-cell are made from semiconducting materials.

8. The method of claim 7, wherein the bottommost layer of the plurality of semiconducting layers is a silicon layer.

9. A method of manufacturing a multi-junction solar cell comprising:
    providing a first semiconducting wafer and a second semiconducting wafer, wherein each of the first and second semiconducting wafers incorporates at least one p-n junction;
    applying an interface bonding layer consisting of selenium to a bottom surface of the first semiconducting wafer and/or to a top surface of the second semiconducting wafer;
    stacking the first semiconducting wafer on the second semiconducting wafer such that the selenium interface bonding layer is disposed between the first semiconducting wafer and the second semiconducting wafer;
    applying pressure to the first semiconducting wafer and to the second semiconducting wafer;
    heating the interface bonding layer to a temperature for a period sufficient for the interface bonding layer to form a bond that adheres the first and second semiconducting wafers together; and
    cooling the multi-junction solar cell to an ambient temperature.

10. The method of claim 9, wherein heating the interface bonding layer to a temperature for a period sufficient for the interface bonding layer to form a bond that adheres the first and second semiconducting wafers together comprises heating the interface bonding layer to its melting temperature for a period of time for the interface bonding layer to melt.

11. The method of claim 9, wherein at least one solar cell is manufactured on at least one semiconducting wafer of the first and second semiconducting wafers, said at least one semiconducting wafer serving as a mechanical substrate.

12. A method of connecting two individual solar cells into an optically and mechanically coupled multijunction solar cell comprising:
    providing a first solar cell;
    providing a second solar cell;
    providing a layer consisting of selenium disposed between the two solar cells;
    stacking the elements together to form a stack; and
    heating the stack to such a temperature such that the selenium of the layer consisting of selenium serves as an adhesive between the first and second solar cells.

13. The method of claim 12 further comprising applying pressure to the stack while heating the stack.

14. The method of claim 12 further comprising heating the stack to a temperature sufficient to melt the selenium of the layer consisting of selenium.

15. The method of claim 12 wherein at least one of the solar cells of the first and second solar cells is manufactured on a silicon wafer, the silicon wafer serving as a mechanical substrate.

16. The method of claim 12 further comprising heating the sack to a temperature sufficient to melt the selenium of the layer consisting of selenium; applying pressure to the stack while heating the stack, wherein at least one of the solar cells of the first and second solar cells is manufactured on a silicon wafer, the silicon wafer serving as a mechanical substrate.

* * * * *